United States Patent
Son et al.

(10) Patent No.: US 9,654,079 B2
(45) Date of Patent: May 16, 2017

(54) COMPOSITE ELECTRONIC COMPONENT AND A BOARD FOR MOUNTING THE SAME

(71) Applicant: SAMSUNG ELECTRO-MECHANICS CO., LTD., Suwon-Si, Gyeonggi-Do (KR)

(72) Inventors: Soo Hwan Son, Suwon-Si (KR); Jin Woo Hahn, Suwon-Si (KR); Joon Hwan Kwag, Suwon-Si (KR); Kyoung No Lee, Suwon-Si (KR); Myeong Gi Kim, Suwon-Si (KR); Hwan Soo Lee, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 165 days.

(21) Appl. No.: 14/315,110

(22) Filed: Jun. 25, 2014

(65) Prior Publication Data
US 2015/0109074 A1    Apr. 23, 2015

(30) Foreign Application Priority Data
Oct. 18, 2013    (KR) ................. 10-2013-0124710

(51) Int. Cl.
*H03H 7/01*    (2006.01)
*H03H 1/00*    (2006.01)

(52) U.S. Cl.
CPC ... *H03H 7/0115* (2013.01); *H03H 2001/0085* (2013.01)

(58) Field of Classification Search
CPC .............. H03H 2001/0085; H03H 7/0115
USPC ................... 333/175, 185; 336/200
See application file for complete search history.

(56) References Cited

U.S. PATENT DOCUMENTS

| 6,094,112 A * | 7/2000 | Goldberger .............. H03H 3/00 333/184 |
| 2002/0003281 A1 * | 1/2002 | Ibata ................... H01F 27/2804 257/531 |
| 2003/0030510 A1 | 2/2003 | Sasaki et al. |
| 2008/0254968 A1 * | 10/2008 | Kakuda ................. C04B 35/465 501/137 |
| 2013/0249645 A1 * | 9/2013 | Kim .................... H01F 17/0013 333/175 |

(Continued)

FOREIGN PATENT DOCUMENTS

| JP | 11-087793 A | 3/1999 |
| JP | 2001-176728 A | 6/2001 |
| KR | 2003-0014586 A | 2/2003 |

*Primary Examiner* — Stephen E Jones
*Assistant Examiner* — Rakesh Patel
(74) *Attorney, Agent, or Firm* — McDermott Will & Emery LLP

(57) ABSTRACT

A composite electronic component may include: a composite body including a capacitor formed of a ceramic body in which a plurality of dielectric layers and first and second internal electrodes are laminated, and an inductor formed of a magnetic body including a coil; an input terminal disposed on a first end surface of the composite body; output terminals including a first output terminal disposed on a second end surface of the composite body and a second output terminal disposed on the second end surface of the composite body; and a ground terminal disposed on one or more of upper and lower surfaces and the first end surface of the capacitor of the composite body. The capacitor is adjacent to the inductor.

28 Claims, 16 Drawing Sheets

(56) References Cited

U.S. PATENT DOCUMENTS

2014/0266093 A1* 9/2014 Isham .................. H02M 3/158
　　　　　　　　　　　　　　　　　　　　　　323/271

* cited by examiner

COMPOSITE ELECTRONIC COMPONENT AND A BOARD FOR MOUNTING THE SAME

CROSS-REFERENCE TO RELATED APPLICATION

This application claims the benefit of priority to Korean Patent Application No. 10-2013-0124710 filed on Oct. 18, 2013, with the Korean Intellectual Property Office, the disclosure of which is incorporated herein by reference.

BACKGROUND

The present disclosure relates to a composite electronic component including a plurality of passive elements and a board for mounting the same.

Recently, electronic devices have been miniaturized, while still a need exists for diversity in the functionality thereof, lighter, thinner, shorter, and smaller devices and retaining high levels of performance.

In order to meet various service requirements, electronic devices have a power semiconductor-based power management integrated circuit (PMIC) undertaking a function of effectively controlling and managing limited battery charge resources.

However, the provision of various functions in electronic devices may lead to an increase in the number of DC/DC convertors provided in a PMIC and the number of passive elements provided in a power input terminal and a power output terminal of a PMIC as well.

In this case, an area for disposing components of electronic devices is inevitably increased, posing an obstacle to the miniaturization of electronic devices.

In addition, wiring patterns of the PMIC and peripheral circuits thereof may generate a significant amount of noise.

In order to address the above problem, a composite electronic component including an inductor and a capacitor combined up and down has been researched to obtain an effect of reducing a component layout area of the electronic device and suppressing the generation of noise.

However, in the case that an inductor and a capacitor are disposed up and down, magnetic flux generated by the inductor may affect internal electrodes of the capacitor to generate parasitic capacitance, shifting a self-resonant frequency (SRF) toward a low frequency side.

Meanwhile, the reduction in size of a composite electronic component leads to a reduction in thickness of internal magnetic layers serving to prevent a magnetic field of the inductor, which results in a degradation of a quality factor (Q factor).

SUMMARY

An aspect of the present disclosure may provide a composite electronic component having a reduced component mounting area in a driving power supply system, and a board for mounting the same.

An aspect of the present disclosure may also provide a composite electronic component capable of suppressing the generation of noise in a driving power supply system, and a board for mounting the same.

According to an aspect of the present disclosure, a composite electronic component may include: a composite body including a capacitor and inductor being attached to each other, the capacitor having a ceramic body in which a plurality of dielectric layers and first and second internal electrodes are laminated, the first and second internal electrodes being disposed to face each other with the dielectric layers interposed therebetween, and the inductor having a magnetic body including a coil; an input terminal disposed on a first end surface of the composite body and connected to the coil of the inductor; output terminals including a first output terminal disposed on a second end surface of the composite body and connected to the coil unit of the inductor and a second output terminal disposed on the second end surface of the composite body and connected to the first internal electrodes of the capacitor; and a ground terminal disposed on one or more of upper and lower surfaces and the first end surface of the capacitor of the composite body and connected to the second internal electrodes of the capacitor.

The magnetic body includes a plurality of magnetic layers, each having a conductive pattern formed thereon, and the conductive patterns may constitute the coil.

The inductor may be a thin film type inductor in which the magnetic body includes an insulating layer and a coil formed on at least one surface of the insulating substrate.

The magnetic body may include a core and a winding coil wound around the core.

The inductor may be a power inductor.

The capacitor and the inductor may be connected by a conductive adhesive.

According to another aspect of the present disclosure, a composite electronic component may include: a composite body including a first capacitor, a second capacitor and an inductor, the first and second capacitors being attached to both sides of the inductor respectively. The first capacitor has a ceramic body in which a plurality of dielectric layers and first and second internal electrodes are laminated, the first and second internal electrodes being disposed to face one another with the dielectric layers interposed therebetween. The second capacitor has a ceramic body in which a plurality of dielectric layers and third and fourth internal electrodes are laminated, the third and fourth internal electrodes being disposed to face one another with the dielectric layers interposed therebetween. The inductor includes a magnetic body including a coil. The composite electronic component further includes input terminals including a first input terminal disposed on a first end surface of the composite body and connected to the coil of the inductor and a second input terminal disposed on the first end surface of the composite body and connected to the first internal electrodes of the first capacitor; and output terminals including a first output terminal formed on a second end surface of the composite body and connected to the coil of the inductor and a second output terminal formed on the first end surface of the composite body and connected to the third internal electrodes of the second capacitor; and ground terminals including a first ground terminal disposed on the second end surface of the composite body and connected to the second internal electrodes of the first capacitor and a second ground terminal disposed on the second end surface of the composite body and connected to the fourth internal electrodes of the second capacitor.

According to another aspect of the present disclosure, a composite electronic component may include: a composite body including a capacitor and an inductor being attached to each other, the capacitor including a ceramic body in which a plurality of dielectric layers and first to third internal electrodes are laminated, the first to third internal electrodes being disposed to face each other with the dielectric layers interposed therebetween, and the inductor having a magnetic body including a coil unit; input terminals including a first input terminal formed on a first end surface of the composite body and connected to the coil unit of the inductor, and a second input terminal formed on the first end surface of the composite body and connected to the first internal electrodes of the capacitor; output terminals including a first output terminal formed on a second end surface of the composite body and connected to the coil unit of the inductor and a second output terminal formed on the second end surface of the composite body and connected to the third internal electrodes of the capacitor; and a ground terminal formed on one or more of upper and lower surfaces and a first lateral surface of the capacitor of the composite body and connected to the second internal electrodes of the capacitor.

Each of the first internal electrodes may have a lead out portion exposed to the first end surface of the composite body, each of the second internal electrodes may have a lead out portion exposed to the first lateral surface of the composite body, and each of the third internal electrodes may have a lead out portion exposed to the second end surface.

According to another aspect of the present disclosure, a composite electronic component may include: a composite body including a first capacitor, a second capacitor, a first inductor and a second inductor. The first and second inductor are adjacent each other. The first capacitor is attached to a side of the first inductor and the second capacitor is attached to a side of the second inductor. The first capacitor includes a ceramic body in which a plurality of dielectric layers and first to third internal electrodes are laminated, the first to third internal electrodes being disposed to face each other with the dielectric layers interposed therebetween. The second capacitor includes a ceramic body in which a plurality of dielectric layers and fourth to sixth internal electrodes are laminated, the fourth to sixth internal electrodes being disposed to face each other with the dielectric layers interposed therebetween. The inductor includes a magnetic body including a coil. The composite electronic component includes input terminals including a first input terminal disposed on a first end surface of the composite body and connected to the coil of the second inductor, a second input terminal disposed on the first end surface of the composite body and connected to the coil of the second inductor, a third input terminal disposed on the first end surface of the composite body and connected to the first internal electrodes of the first capacitor, and a fourth input terminal formed on the first end surface of the composite body and connected to the fourth internal electrodes of the second capacitor. The composite electronic component further includes output terminals including a first output terminal disposed on a second end surface of the composite body and connected to the coil of the first inductor, a second output terminal disposed on the second end surface of the composite body and connected to the coil of the second inductor, a third output terminal disposed on the second end surface of the composite body and connected to the third internal electrodes of the first capacitor, and a fourth output terminal disposed on the second end surface of the composite body and connected to the sixth internal electrodes of the second capacitor; and ground terminals including a first ground terminal disposed on one or more of upper and lower surfaces and a first lateral surface of the first capacitor of the composite body and connected to the second internal electrodes of the first capacitor and a second ground terminal disposed on one or more of upper and lower surfaces and a first lateral surface of the second capacitor of the composite body and connected to the fifth internal electrodes of the second capacitor.

According to another aspect of the present disclosure, a composite electronic component may include: an input terminal receiving converted power from a power management unit; a power smoothing unit smoothing power and including a composite body including a capacitor formed of a ceramic body in which a plurality of dielectric layers and first and second internal electrodes are laminated, the first and second internal electrodes being disposed to face one another with the dielectric layers interposed therebetween, and an inductor formed of a magnetic body including a coil. The capacitor is attached to the side of the inductor. The composite electronic component further includes an output terminal supplying smoothed power; and a ground terminal for grounding.

The input terminal may be disposed on a first end surface of the composite body, the output terminal may include a first output terminal formed on a second end surface of the composite body and connected to the coil of the inductor and a second output terminal disposed on the second end surface of the composite body and connected to the first internal electrodes of the capacitor, and the ground terminal may be disposed on one or more of upper and lower surfaces and the first end surface of the capacitor of the composite body and connected to the second internal electrodes of the capacitor.

The magnetic body may include a plurality of magnetic layers, each having a conductive pattern formed thereon, and the conductive patterns may constitute the coil.

The inductor may be a thin film type inductor in which the magnetic body includes an insulating layer and a coil disposed on at least one surface of the insulating substrate.

The magnetic body may include a core and a winding coil wound around the core.

The inductor may be a power inductor.

The capacitor and the inductor may be connected by a conductive adhesive.

According to another aspect of the present disclosure, a board having a composite electronic component mounted thereon may include: a printed circuit board (PCB) having three or more electrode pads formed on an upper surface thereof; the composite electronic component installed on the PCB; and solder connecting the electrode pads and the composite electronic component.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
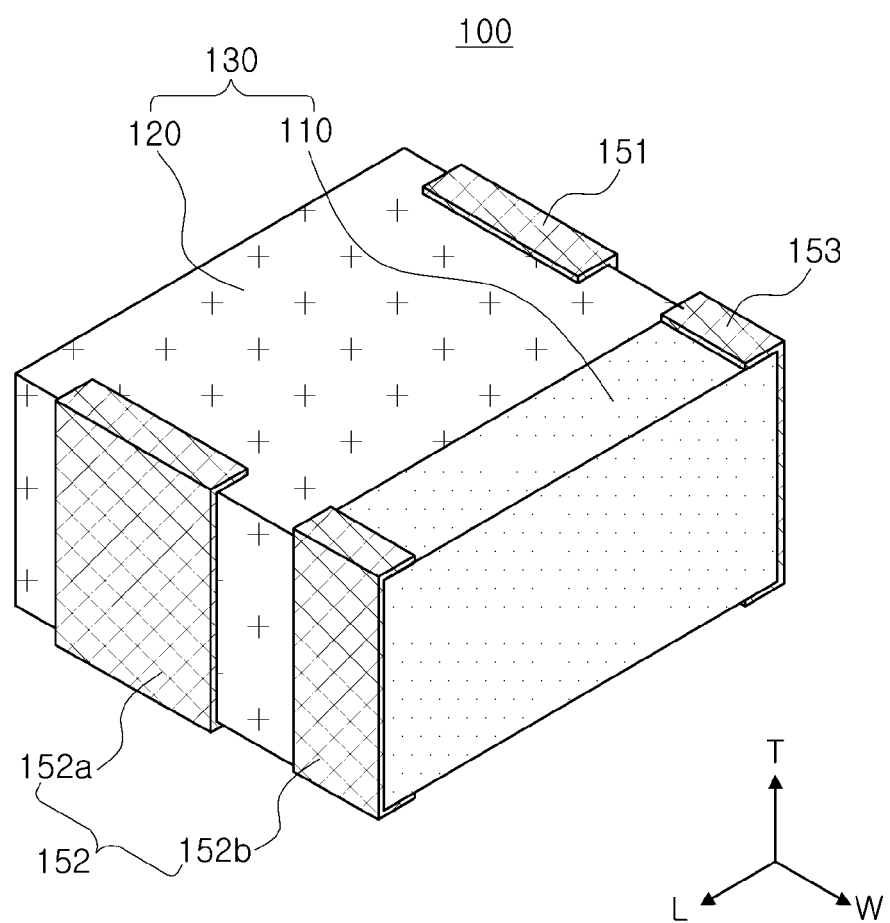
FIG. 1 is a perspective view schematically illustrating a composite electronic component according to an exemplary embodiment of the present disclosure.

Hereinafter, exemplary embodiments of the present disclosure will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Composite Electronic Component

Hereinafter, exemplary embodiments of the present disclosure will be described with reference to the accompanying drawings.

FIG. 1 is a perspective view schematically illustrating a composite electronic component according to an exemplary embodiment of the present disclosure.

Figure 2:
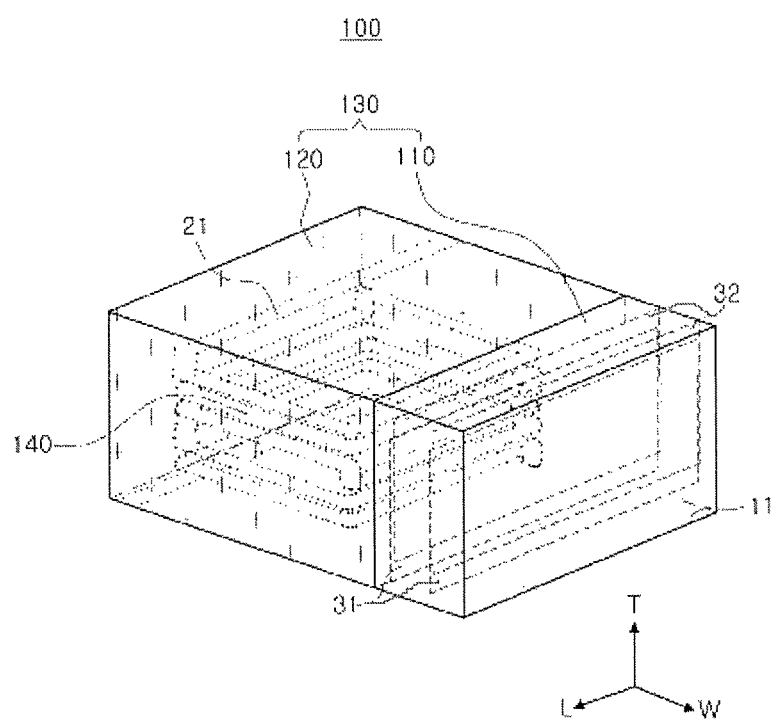
FIG. 2 is a perspective view schematically illustrating an interior of the composite electronic component of FIG. 1 according to a first exemplary embodiment of the present disclosure.

FIG. 2 is a perspective view schematically illustrating an interior of the composite electronic component of FIG. 1 according to a first exemplary embodiment of the present disclosure.

Figure 3:
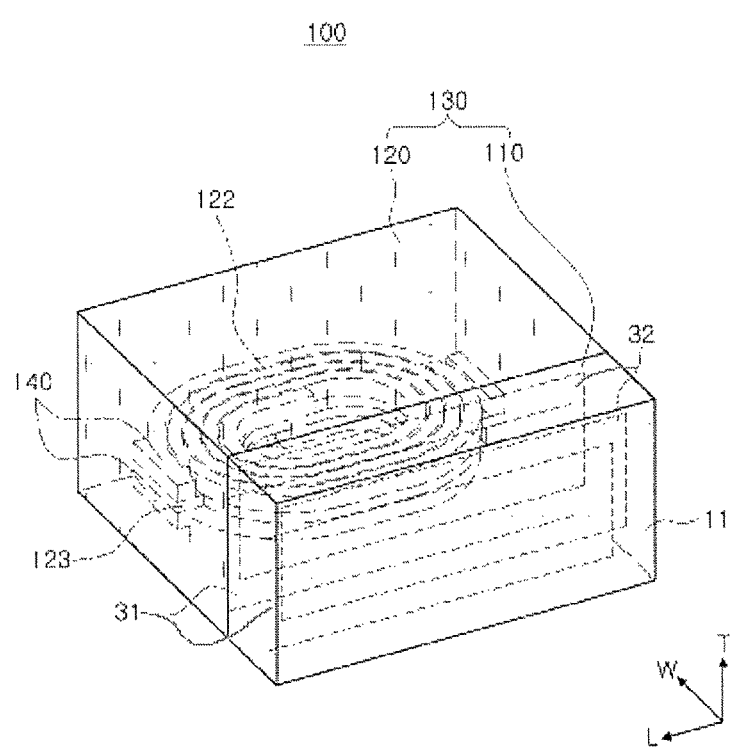
FIG. 3 is a perspective view schematically illustrating an interior of the composite electronic component of FIG. 1 according to a second exemplary embodiment of the present disclosure.

FIG. 3 is a perspective view schematically illustrating an interior of the composite electronic component of FIG. 1 according to a second exemplary embodiment of the present disclosure.

Figure 4:
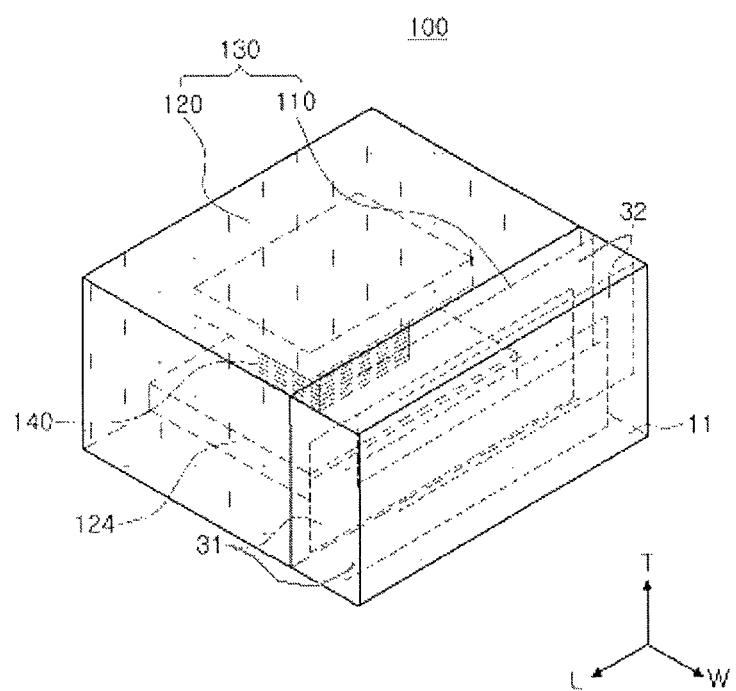
FIG. 4 is a perspective view schematically illustrating an interior of the composite electronic component of FIG. 1 according to a third exemplary embodiment of the present disclosure.

FIG. 4 is a perspective view schematically illustrating an interior of the composite electronic component of FIG. 1 according to a third exemplary embodiment of the present disclosure.

Figure 5:
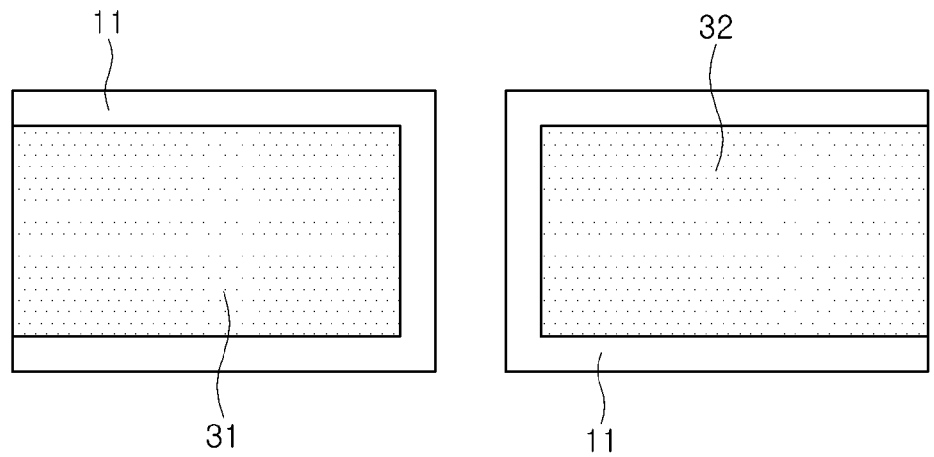
FIG. 5 is a plan view illustrating internal electrodes employable in a multilayer ceramic capacitor included in the composite electronic component illustrated in FIG. 1.

FIG. 5 is a plan view illustrating internal electrodes employable in a multilayer ceramic capacitor included in the composite electronic component illustrated in FIG. 1.

Referring to FIG. 1, in the composite electronic component according to an exemplary embodiment of the present disclosure, it is defined that a 'length direction' is 'L', a 'width direction' is 'W', and a 'thickness direction' is 'T' as depicted in FIG. 1. Here, the 'thickness direction' may be used as having the same meaning as a 'lamination direction' in which dielectric layers of a capacitor are laminated.

Meanwhile, as described hereinafter, it is defined that length, width, and thickness directions of the composite electronic component are identical to length, width, and thickness directions of a capacitor and an inductor.

Also, in an exemplary embodiment of the present disclosure, the composite electronic component may have upper and lower surfaces opposing one another, and first and second lateral surfaces and first and second end surfaces connecting the upper and lower surfaces. A shape of the composite electronic component is not particularly limited, and as illustrated, the composite electronic component may have a hexahedral shape.

Also, the first and second lateral surfaces and first and second end surfaces of the composite electronic component will be defined as being identical to the first and second lateral surfaces and first and second end surfaces of a capacitor and an inductor in the same directions.

Meanwhile, the composite electronic component is a combination of a capacitor and an inductor, and in a case in which a capacitor is disposed on the top of an inductor, an upper surface of the composite electronic component may be defined as an upper surface of the capacitor and a lower surface of the composite electronic component may be defined as a lower surface of the inductor.

Conversely, in a case in which an inductor is disposed on the top of a capacitor, an upper surface of the composite electronic component may be defined as an upper surface of the inductor and a lower surface of the composite electronic component may be defined as a lower surface of the capacitor.

Also, first and second lateral surfaces correspond to surfaces of the composite electronic component opposing one another in the width direction, first and second end surfaces correspond to surfaces of the composite electronic component opposing one another in the length direction, and the upper and lower surfaces correspond to surfaces of the composite electronic component opposing one another in the thickness direction.

Referring to FIGS. 1 through 3, a composite electronic component 100 according to an exemplary embodiment of the present disclosure includes a composite body 130 including a capacitor 110 formed of a ceramic body in which a plurality of dielectric layers 11 and first and second internal electrodes 31 and 32 are laminated such that the internal electrodes are disposed to face each other with the dielectric layers 11 interposed therebetween and an inductor 120 formed of a magnetic body including a coil 140.

In the present exemplary embodiment, the composite body 130 has upper and lower surfaces opposing one another, and first and second lateral surfaces and first and second end surfaces connecting the upper and lower surfaces.

The composite body 130 may have a hexahedral shape as illustrated, but the present disclosure is not limited thereto.

The hexahedral composite body 130 may be formed by combining the capacitor 110 and the inductor 120, and here, a method of forming the composite body 130 is not particularly limited.

For example, the composite body 130 may be formed by combining separately-manufactured capacitor 110 and inductor 120 with a conductive adhesive, a resin, or the like, or by sequentially stacking the ceramic body of the capacitor 110 and the magnetic body of the inductor 120, without being particularly limited.

For example, the composite body 130 may be formed by attaching separately-manufactured capacitor 110 and inductor 120 with a conductive adhesive, a resin, or the like, without being particularly limited.

In particular, the adhesive or resin used to combine the capacitor 110 and the inductor 120 may be, for example, an epoxy resin, but the present disclosure is not limited thereto.

A method of combining the capacitor 110 and the inductor 120 by using a conductive adhesive, a resin, or the like, is not particularly limited, and a conductive adhesive, a resin, or the like, may be applied to a combining surface of the capacitor 110 or the inductor 120, heated, and cured to combine the capacitor 110 and the inductor 120.

Meanwhile, according to the exemplary embodiment of the present disclosure, the capacitor 110 may be attached to the side of the inductor 120. However, the present disclosure is not limited thereto and the capacitor 110 and the inductor 120 may be variously disposed.

Hereinafter, the capacitor 110 and the inductor 120 constituting the composite body 130 will be described in detail.

According to the present exemplary embodiment, the magnetic body constituting the inductor 120 may include the coil 140.

The inductor 120 may be, for example, a laminated-type inductor, a thin film-type inductor, or a winding-type inductor, without being particularly limited. In addition, a laser helixing-type inductor, or the like, may also be used.

The laminated-type inductor refers to an inductor manufactured by printing a thick electrode on a thin ferrite or glass ceramic sheet, stacking several layers of sheets with coil patterns printed thereon, and connecting internal conducting wires through via holes.

The thin film-type inductor refers to an inductor manufactured by forming coil conducting wires on a ceramic substrate through thin film sputtering or plating, and filling the interior with a ferritic material.

The winding-type inductor refers to an inductor manufactured by winding a line material (coil conducting wire) around a core.

The laser helixing-type inductor refers to an inductor manufactured by forming an electrode layer on a ceramic bobbin through sputtering or plating, shaping a coil by laser helixing, and subsequently processing the coil into a terminal with an external protective film resin.

Referring to FIG. 2, in a composite electronic component according to a first exemplary embodiment of the present disclosure, the inductor 120 may be a laminated-type inductor.

In detail, the magnetic body may have a plurality of magnetic layers 21, each having a conductive pattern 41 formed thereon are laminated, and the conductive patterns 41 form the coil 40.

Referring to FIG. 3, in a composite electronic component according to a second exemplary embodiment of the present disclosure, the inductor 120 may be a thin film-type inductor.

In detail, the inductor 120 may a thin film type inductor in which the magnetic body includes an insulating substrate 123 and a coil formed on at least one surface of the insulating substrate 123.

The magnetic body may be formed by filling upper and lower portions of the insulating substrate 123 having the coil formed on at least one surface thereof with a magnet 122.

Referring to FIG. 4, in a composite electronic component according to a third exemplary embodiment of the present disclosure, the inductor 120 may be a winding-type inductor.

In detail, the magnetic body of the inductor 120 may include a core 124 and a coil wound around the core 124.

Referring to FIGS. 2 through 4, first and second internal electrodes 31 and 32 of the capacitor 110 are laminated to be perpendicular with respect to a mounting source, but the present disclosure is not limited thereto and the first and second internal electrodes 31 and 32 may be laminated to be horizontal with respect to the mounting surface.

The magnetic layers 21 and the magnet 122 are formed of a Ni—Cu—Zn-based, Ni—Cu—Zn—Mg-based, Mn—Zn-based, or ferrite-based material, but the present disclosure is not limited thereto.

According to an exemplary embodiment, the inductor 120 may be a power inductor applicable to a high current.

The power inductor is an efficient inductor whose inductance is changed to be less than that of a general inductor when a DC is applied thereto. Namely, the power inductor may be considered an inductor having even DC bias characteristics (a change in inductance when a DC voltage is applied) in addition to a function of a general inductor.

Namely, the composite electronic component according to the exemplary embodiment of the present disclosure, which is used in a power management integrated circuit (PMIC), may include an efficient power inductor whose inductance is rarely changed when a DC voltage is applied thereto, rather than a general inductor.

Meanwhile, the ceramic body constituting the capacitor 110 may be formed by laminating a plurality of dielectric layers 11, and a plurality of internal electrodes 31 and 32 (first and second internal electrodes, sequentially) may be separately disposed with the dielectric layer interposed therebetween within the ceramic body.

The dielectric layers 11 may be formed by firing a ceramic green sheet including ceramic powder, an organic solvent, and an organic binder. The ceramic powder may be formed of a barium titanate ($BaTiO_3$)-based material, a strontium titanate ($SrTiO_3$)-based material as a material having a high degree of permittivity (dielectric constant), but the present disclosure is not limited thereto.

Meanwhile, according to the exemplary embodiment of the present disclosure, the first internal electrodes 31 may be exposed to the first end surface of the composite body 130 and the second internal electrodes 32 may be exposed to the second end surface of the composite body 130, but the present disclosure is not limited thereto.

According to the exemplary embodiment of the present disclosure, the first and second internal electrodes 31 and 32 may be formed of a conductive paste including a conductive metal.

The conductive metal may be a nickel (Ni), copper (Cu), palladium (Pd), or alloys thereof, but the present disclosure is not limited thereto.

The first and second internal electrodes 31 and 32 may be formed by printing a conductive paste on each ceramic green sheet forming the dielectric layer 11 through a printing method such as a screen printing method or a gravure printing method.

The ceramic green sheets with the internal electrodes printed thereon may be alternately laminated and fired to form the ceramic body.

In FIG. 5, pattern shapes of the first and second internal electrodes 31 and 32 are illustrated, but the present disclosure is not limited thereto and the pattern shapes of the first and second internal electrodes 31 and 32 may be variously modified.

The capacitor may serve to adjust a voltage supplied from a power management unit (or the PMIC).

The composite electronic component 100 according to an exemplary embodiment of the present disclosure may include: an input terminal 151 formed on the first end surface of the composite body 130 and connected to the coil unit 140 of the inductor 120; output terminals 152 including a first output terminal 152a formed on the second end surface of the composite body 130 and connected to the coil unit 140 of the inductor 120 and a second output terminal 152b formed on the second end surface of the composite body 130 and connected to the first internal electrodes 31 of the capacitor 110; and a ground terminal 153 formed on one or more of the upper and lower surfaces and the first end surface of the capacitor 110 of the composite body 130 and connected to the second internal electrodes 32 of the capacitor 110.

The input terminal 151 and the output terminal 152b may be connected to the coil 140 of the inductor 120 to serve as an inductor within the composite electronic component.

Also, the other output terminal 152a may be connected to the first internal electrodes 31 of the capacitor 110, and the second internal electrodes 32 of the capacitor 110 may be connected to the ground terminal 153 to serve as a capacitor within the composite electronic component.

The input terminal 151, the output terminal 152, and the ground terminal 153 may be formed of a conductive paste including a conductive metal.

The conductive metal may be nickel (Ni), copper (Cu), tin (Sn), or alloys thereof, but the present disclosure is not limited thereto.

The conductive paste may further include an insulating material, and here, the insulating material may be, for example, glass, but the present disclosure is not limited thereto.

A method of forming the input terminal 151, the output terminal 152, and the ground terminal 153 is not particularly limited. Namely, the input terminal 151, the output terminal 152, and the ground terminal 153 may be formed by dipping the ceramic body or by using any other method such as plating, or the like.

Figure 6:
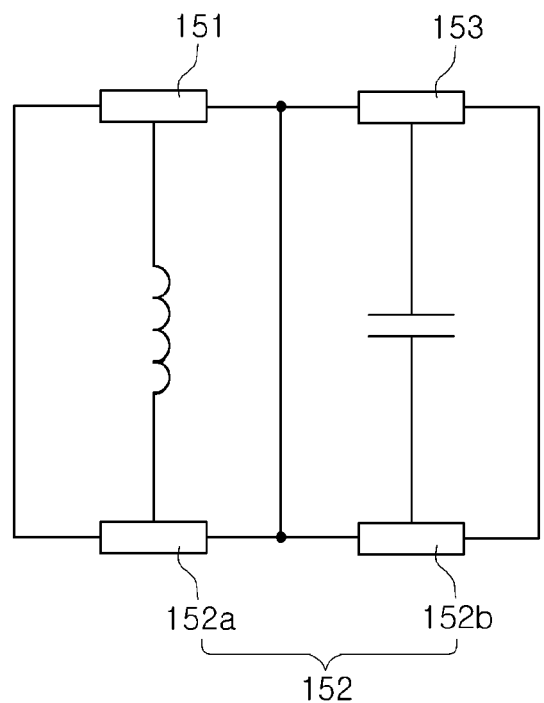
FIG. 6 is an equivalent circuit diagram of the composite electronic component illustrated in FIG. 1.

FIG. 6 is an equivalent circuit diagram of the composite electronic component illustrated in FIG. 1.

Referring to FIG. 6, unlike the related art, in the composite electronic component according to the exemplary embodiment of the present disclosure, the inductor 120 and the capacitor 110 are combined, so the inductor 120 and the capacitor 110 may be designed to have a shortest distance therebetween, thus reducing noise.

In addition, since the inductor 120 and the capacitor 110 are combined, a mounting area in the power management unit may be minimized, advantageously securing a mounting space.

Also, mounting costs may be reduced.

Meanwhile, as various functions are provided in electronic devices, the number of DC/DC converters provided in a PMIC is increased and the number of passive elements provided in a power input terminal and a power output terminal of a PMIC is also increased as well.

In this case, an area for disposing components of electronic devices is inevitably increased, posing an obstacle to the miniaturization of electronic devices.

In addition, wiring patterns of the PMIC and peripheral circuits thereof generate significant amounts of noise.

In order to address the above problem, a composite electronic component combining an inductor and a capacitor up and down has been researched and effects of reducing a layout area of components of an electronic device and suppressing noise generation have been obtained.

However, when the inductor and the capacitor are disposed up and down as mentioned above, magnetic flux generated by the inductor may affect internal electrodes of the capacitor to generate parasitic capacitance, making a self-resonant frequency (SRF) shifted toward a low frequency.

In the case in which the self-resonant frequency (SRF) is shifted toward a low frequency as mentioned above, a frequency range of the inductor that may be used in the exemplary embodiment of the present disclosure may be narrowed.

Namely, a function of the inductor may not be executed in a high frequency range higher than the self-resonant frequency (SRF), so, if the SRF is shifted toward a low frequency, an available frequency range may be limited.

However, according to the exemplary embodiment of the present disclosure, since the capacitor 110 is attached to the side of the inductor 120, the influence of magnetic flux generated by the inductor on the internal electrodes of the capacitor may be minimized to prevent a change in a self-resonant frequency (SRF).

Namely, according to the exemplary embodiment of the present disclosure, the inductor 120 and the capacitor 110 may be designed within a shortest distance, obtaining an effect of not limiting a range of the inductor that may be used in a low frequency by preventing a change in SRF, as well as an effect of reducing noise.

Meanwhile, due to the miniaturized composite electronic component, an internal magnetic layer prevents a magnetic field of the inductor from becoming thinner, and degrading a quality factor (Q factor).

The Q factor refers to device loss or a degradation of efficiency, and as the Q factor is higher, the loss becomes smaller and efficiency becomes higher.

Namely, according to the exemplary embodiment of the present disclosure, since the capacitor 110 is coupled to the side of the inductor 120, influence of respective components on each other may be minimized, thus preventing a degradation of the Q factor of the components.

The SRF and Q factor will be described in more detail hereinbelow.

Figure 7:
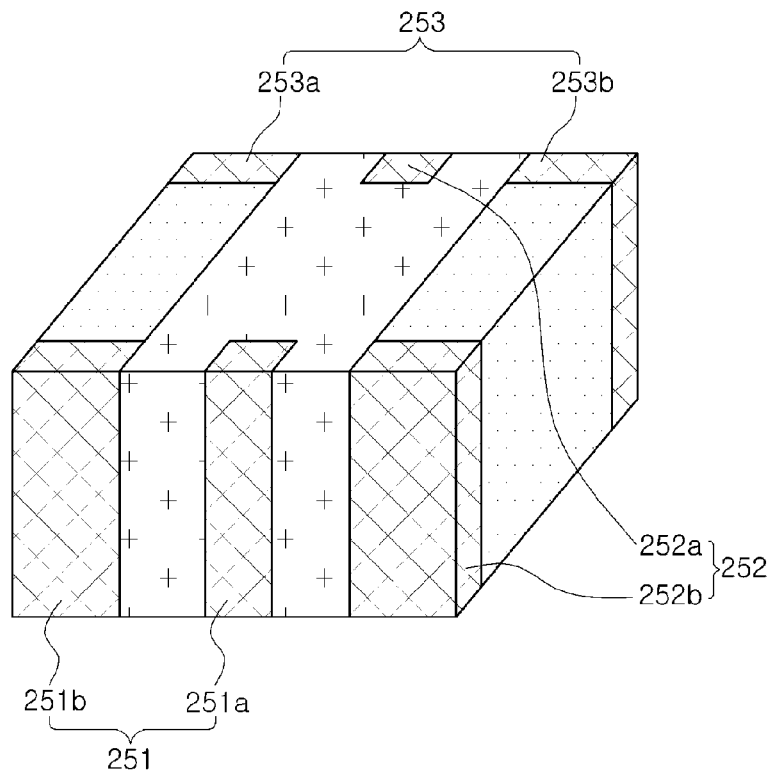
FIG. 7 is a perspective view schematically illustrating a composite electronic component according to another exemplary embodiment of the present disclosure.

FIG. 7 is a perspective view schematically illustrating a composite electronic component according to another exemplary embodiment of the present disclosure.

Figure 8:
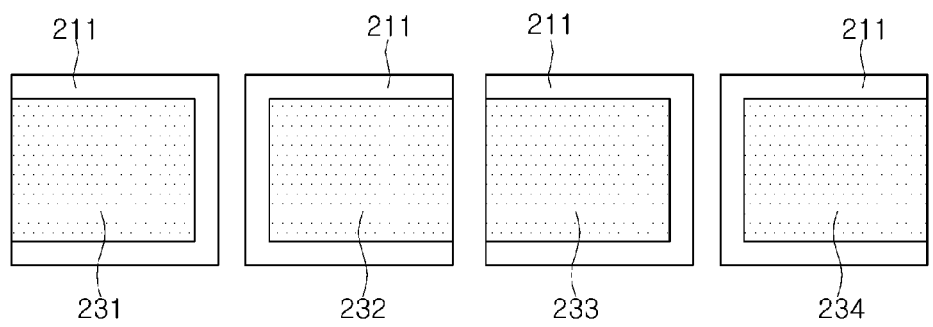
FIG. 8 is a plan view illustrating internal electrodes employable in a multilayer ceramic capacitor included in the composite electronic component illustrated in FIG. 7.

FIG. 8 is a plan view illustrating internal electrodes employable in a multilayer ceramic capacitor included in the composite electronic component illustrated in FIG. 7.

Figure 9:
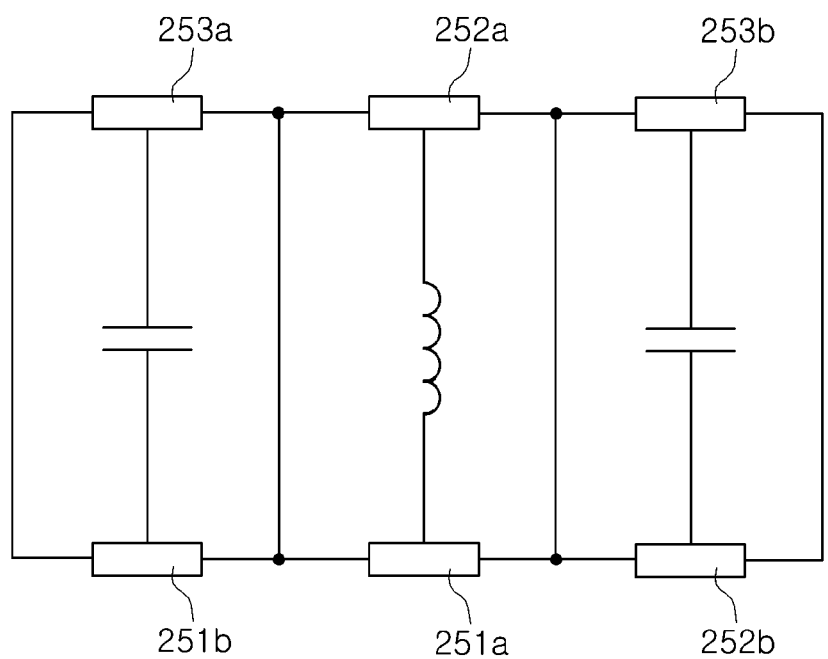
FIG. 9 is an equivalent circuit diagram of the composite electronic component illustrated in FIG. 7.

FIG. 9 is an equivalent circuit diagram of the composite electronic component illustrated in FIG. 7.

Referring to FIGS. 7 through 9, a composite electronic component according to another exemplary embodiment of the present disclosure may include: a composite body 230 including a combination of a first capacitor 210a formed of a ceramic body in which a plurality of dielectric layers 211 and first and second internal electrodes 231 and 232 are laminated, the first and second internal electrodes 231 and 232 being disposed to face one another with the dielectric layers 211 interposed therebetween, a second capacitor 210b in which a plurality of dielectric layers 211 and third and fourth internal electrodes 233 and 234 are laminated, the third and fourth internal electrodes 233 and 234 being disposed to face one another with the dielectric layers 211 interposed therebetween, and an inductor 220 formed of a magnetic body including a coil; input terminals 251 including a first input terminal 251a formed on a first end surface of the composite body 230 and connected to the coil unit of the inductor 220 and a second input terminal 251b formed on the first end surface of the composite body 230 and connected to the first internal electrodes 231 of the first capacitor 210a, output terminals 252 including a first output terminal 252a formed on a second end surface of the composite body 230 and connected to the coil unit of the inductor 220 and a second output terminal 252b formed on the first end surface of the composite body 230 and connected to the third internal electrodes 233 of the second capacitor 210b; and ground terminals 253 including a first ground terminal 253a formed on the second end surface of the composite body 230 and connected to the second internal electrodes 232 of the first capacitor 210a and a second ground terminal 253b formed on the second end surface of the composite body 230 and connected to the fourth internal electrodes 234 of the second capacitor 210b, wherein the first and second capacitors 210a and 210b may be combined with both sides of the inductor 220.

The magnetic body may be configured by laminating a plurality of magnetic layers respectively having a conductive pattern thereon.

The inductor 220 may be a thin film type inductor in which the magnetic body includes an insulating substrate and a coil formed on at least one surface of the insulating substrate.

The magnetic core may include a core and a winding coil wound around the core.

The inductor 220 may be a power inductor.

The first and second capacitors 210a and 210b and the inductor 220 may be connected by a conductive adhesive.

Referring to FIG. 9, according to another exemplary embodiment of the present disclosure, the first capacitor 210a may be a capacitor formed between connection terminals of a battery and a power management unit (or PMIC) and a ground.

The capacitor 210a may reduce noise included in the first power.

Also, the capacitor 210a may charge electric charges. In a case in which the power management unit (or PMIC) instantaneously consumes a large amount of current, the capacitor 210a may discharge charged electric charges to suppress voltage fluctuations in the power management unit.

Meanwhile, like the capacitor 110 of the composite electronic component according to the former exemplary embodiment as described above, the second capacitor 210b may be a capacitor formed between connection terminals of the power management unit (or PMIC) and an output terminal Vdd and a ground.

The second capacitor 210b may reduce noise included in second power output from the power management unit (or PMIC).

The first ground terminal 253a connected to the second internal electrodes of the first capacitor 210a and the second ground terminal 253b formed on the second end surface of the composite body 230 and connected to the fourth internal electrodes of the second capacitor 210b may be connected to electrode pads when the composite body 230 is mounted on a board, so as to be grounded in one direction as described hereinafter.

Other features of the present exemplary embodiment are identical to those of the composite electronic component according to the former exemplary embodiment, so a description thereof will be omitted to avoid redundancy.

Figure 10:
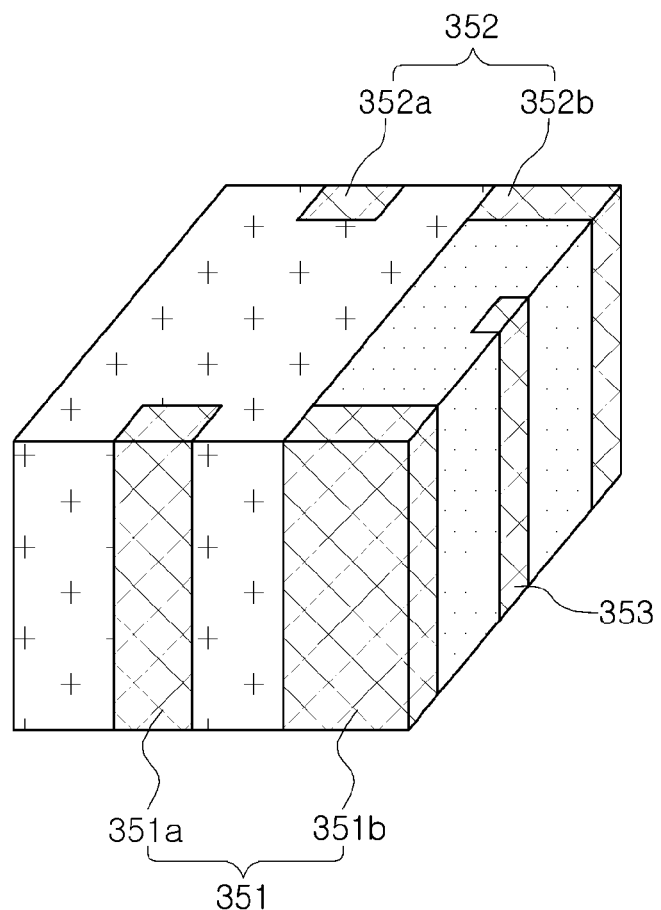
FIG. 10 is a perspective view schematically illustrating a composite electronic component according to another exemplary embodiment of the present disclosure.

FIG. 10 is a perspective view schematically illustrating a composite electronic component according to another exemplary embodiment of the present disclosure.

Figure 11:
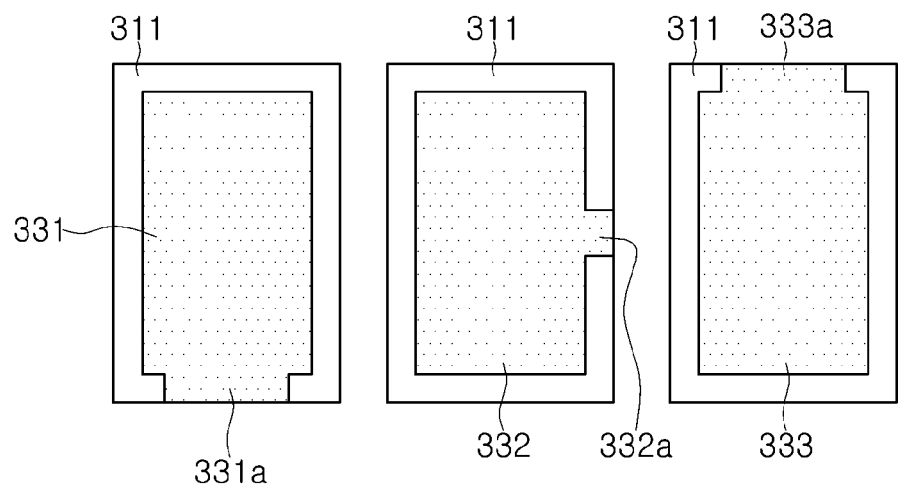
FIG. 11 is a plan view illustrating internal electrodes employable in a multilayer ceramic capacitor included in the composite electronic component illustrated in FIG. 10.

FIG. 11 is a plan view illustrating internal electrodes employable in a multilayer ceramic capacitor included in the composite electronic component illustrated in FIG. 10.

Figure 12:
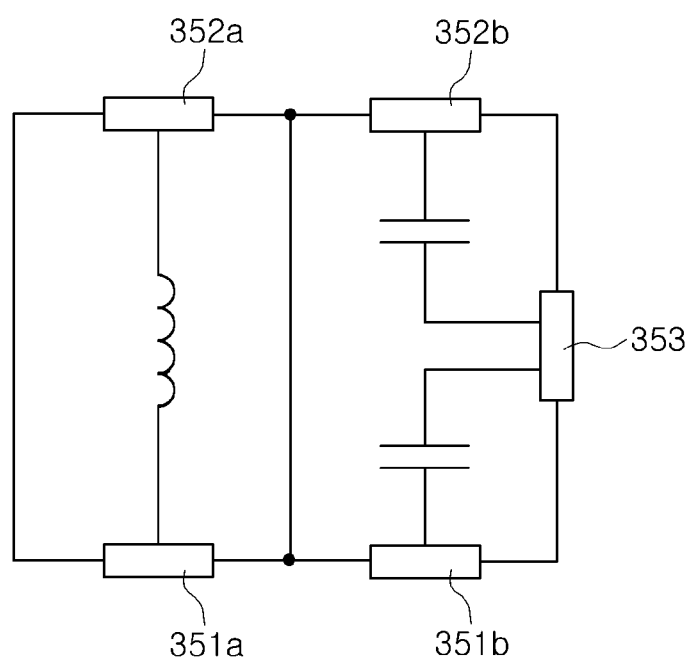
FIG. 12 is an equivalent circuit diagram of the composite electronic component illustrated in FIG. 9.

FIG. 12 is an equivalent circuit diagram of the composite electronic component illustrated in FIG. 9.

Referring to FIGS. 10 through 12, a composite electronic component according to another exemplary embodiment of the present disclosure may include: a composite body 330 including a combination of a capacitor 310 formed of a ceramic body in which a plurality of dielectric layers 311 and first to third internal electrodes 331, 332, and 333 are laminated, the first to third internal electrodes 331, 332, and 333 being disposed to face each other with the dielectric layers 311 interposed therebetween, and an inductor 320 formed of a magnetic body including a coil unit; input terminals 351 including a first input terminal 351a formed on a first end surface of the composite body 330 and connected to the coil unit of the inductor 320, and a second input terminal 351b formed on the first end surface of the composite body 330 and connected to the first internal electrodes 331 of the capacitor 310; output terminals 352 including a first output terminal 352a formed on a second end surface of the composite body 330 and connected to the coil unit of the inductor 320 and a second output terminal 352b formed on the second end surface of the composite body 330 and connected to the third internal electrodes of the capacitor 310; and a ground terminal 353 formed on one or more of upper and lower surfaces and a first lateral surface of the capacitor 310 of the composite body and connected to the second internal electrodes 332 of the capacitor 310, wherein the capacitor 310 may be combined with the side of the inductor 320.

The magnetic body may be configured by laminating a plurality of magnetic layers respectively having a conductive pattern formed thereon, and the conductive patterns may constitute the coil.

The inductor may be a thin film type inductor in which the magnetic body includes an insulating layer and a coil formed on at least one surface of the insulating substrate.

The magnetic body may include a core and a winding coil wound around the core.

The inductor may be a power inductor.

The capacitor and the inductor may be connected by a conductive adhesive.

Referring to FIG. 11, the first internal electrode 331 may have a lead out portion 331a exposed to the first end surface of the composite body 330, the second internal electrode 332 may have a lead out portion 332a exposed to the first lateral surface of the composite body 330, and the third internal electrode 333 may have a lead out portion 333a exposed to the second end surface of the composite body 330.

Referring to FIG. 11, according to the present exemplary embodiment, in the capacitor 310, the first and second internal electrodes 331 and 332 may form a first capacitor unit, and the first capacitor unit may be a capacitor formed between connection terminals of battery and the power management unit (or PMIC) and a ground as described hereinafter.

Namely, the first capacitor unit may reduce noise included in the first power.

Also, the first capacitor unit may charge electric charges. In a case in which the power management unit (or PMIC) instantaneously consumes a large amount of current, the first capacitor unit may discharge charged electric charges to suppress voltage fluctuations in the power management unit.

Meanwhile, in the capacitor 310, the second and third internal electrodes 332 and 333 may form a second capacitor unit, and here, the second capacitor unit may be a capacitor formed between connection terminals of the power management unit (or PMIC) and the output terminal Vdd and a ground, like the capacitor 110 of the composite electronic component according to the former exemplary embodiment as described above.

The second capacitor unit may reduce noise included in second power output from the power management unit (or PMIC).

The second internal electrodes 332 may constitute the first and second capacitor units, respectively, and may be connected to the ground terminal 353 formed on the first lateral surface of the composite body 330 so as to be grounded in one direction.

Other features of the present exemplary embodiment are identical to those of the composite electronic component according to the former exemplary embodiment, so a description thereof will be omitted to avoid redundancy.

Figure 13:
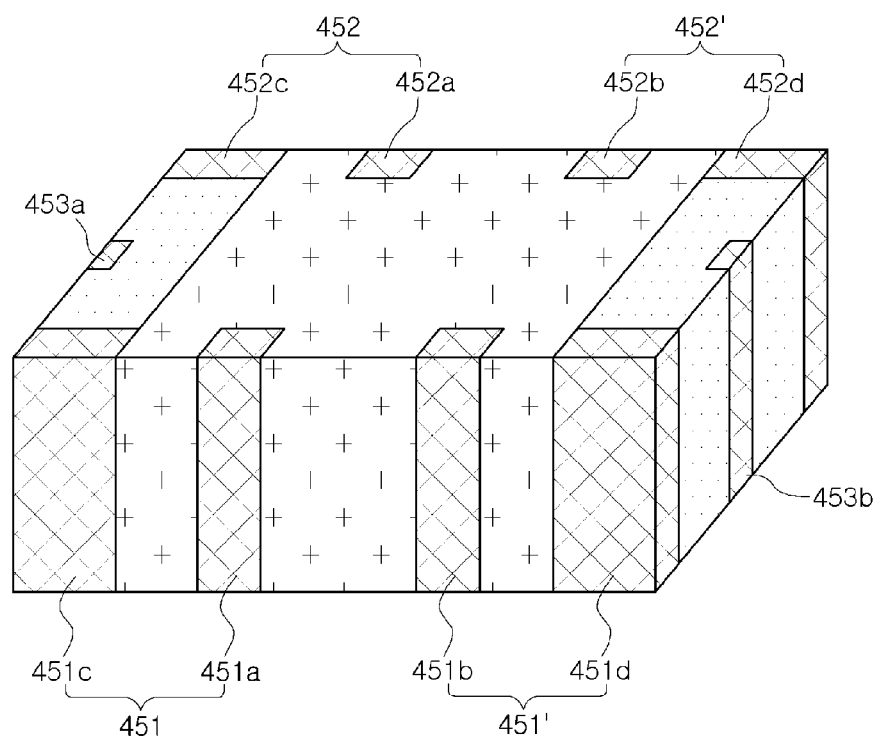
FIG. 13 is a perspective view schematically illustrating a composite electronic component according to another exemplary embodiment of the present disclosure.

FIG. 13 is a perspective view schematically illustrating a composite electronic component according to another exemplary embodiment of the present disclosure.

Figure 14:
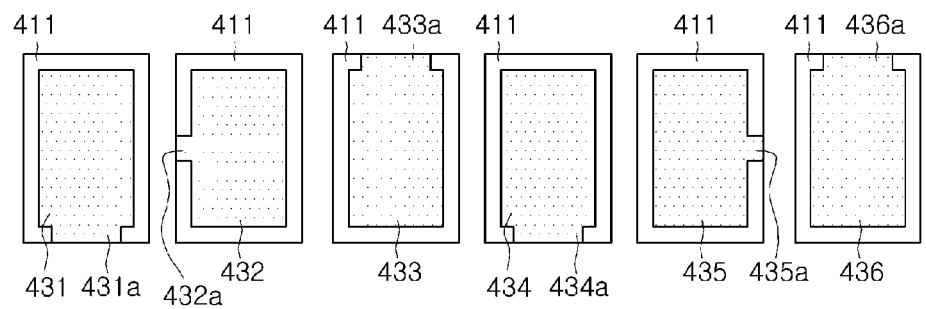
FIG. 14 is a plan view illustrating internal electrodes employable in a multilayer ceramic capacitor included in the composite electronic component illustrated in FIG. 13.

FIG. 14 is a plan view illustrating internal electrodes employable in a multilayer ceramic capacitor included in the composite electronic component illustrated in FIG. 13.

Figure 15:
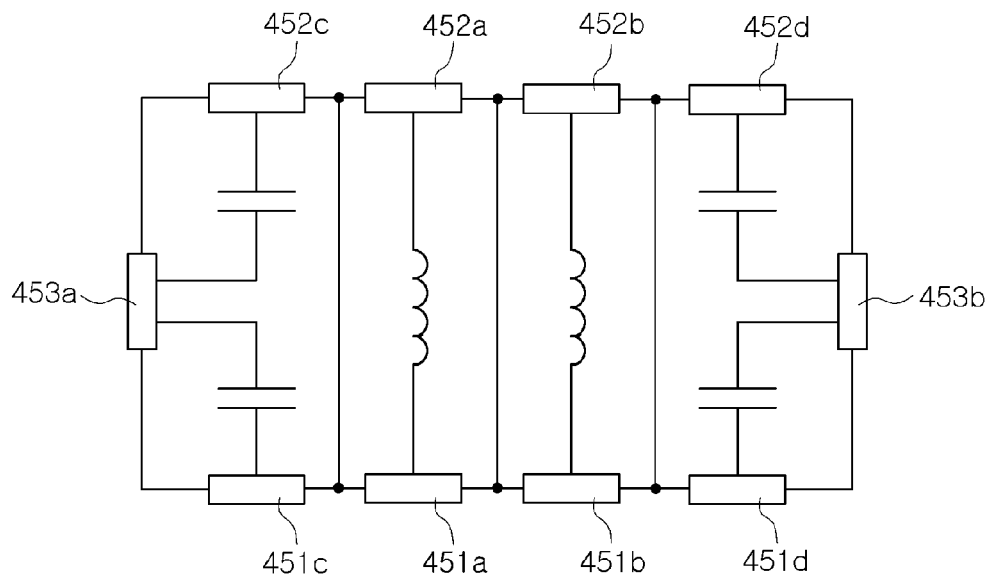
FIG. 15 is an equivalent circuit diagram of the composite electronic component illustrated in FIG. 13.

FIG. 15 is an equivalent circuit diagram of the composite electronic component illustrated in FIG. 13.

Referring to FIGS. 13 through 15, a composite electronic component according to another exemplary embodiment of the present disclosure may include: a composite body 430 including a combination of a first capacitor 410a formed of a ceramic body in which a plurality of dielectric layers 411 and first to third internal electrodes 431, 432, and 433 are laminated, the first to third internal electrodes 431, 432, and 433 being disposed to face each other with the dielectric layers 411 interposed therebetween, a second capacitor 410b formed of a ceramic body in which a plurality of dielectric layers 411 and fourth to sixth internal electrodes 434, 435, and 436 are laminated, the fourth to sixth internal electrodes 434, 435, and 436 being disposed to face each other with the dielectric layers interposed therebetween, and a first inductor 420a and a second inductor 420b formed of a magnetic body including a coil unit; input terminals 451 including a first input terminal 451a formed on a first end surface of the composite body 430 and connected to the coil unit of the second inductor 420a, a second input terminal 451b formed on the first end surface of the composite body 430 and connected to the coil unit of the second inductor 420b, a third input terminal 451c formed on the first end surface of the composite body 430 and connected to the first internal electrodes 431 of the first capacitor 410a, and a fourth input terminal 451d formed on the first end surface of the composite body 430 and connected to the fourth internal electrodes 434 of the second capacitor 410b; output terminals 452 including a first output terminal 452a formed on a second end surface of the composite body 430 and connected to the coil unit of the first inductor 420a, a second output terminal 452b formed on the second end surface of the composite body 430 and connected to the coil unit of the second inductor 420b, a third output terminal 452c formed on the second end surface of the composite body 430 and connected to the third internal electrodes 433 of the first capacitor 410a, and a fourth output terminal 452d formed on the second end surface of the composite body 430 and connected to the sixth internal electrodes 436 of the second capacitor 410b; ground terminals 453 including a first ground terminal 453a formed on one or more of upper and lower surfaces and a first lateral surface of the first capacitor 410a of the composite body 430 and connected to the second internal electrodes 432 of the first capacitor 410a and a second ground terminal 453b formed on one or more of upper and lower surfaces and a first lateral surface of the second capacitor 410b of the composite body 430 and connected to the fifth internal electrodes 435 of the second capacitor 410b, wherein the first and second inductors 420a and 420b are adjacent, the first capacitor 410a is attached to the side of the first inductor 420a, and the second capacitor 410b is attached to the side of the second inductor 420b.

The magnetic body may be configured by laminating a plurality of magnetic layers, each having a conductive pattern formed thereon, and the conductive patterns may constitute the coil.

The inductor may be a thin film type inductor in which the magnetic body includes an insulating layer and a coil formed on at least one surface of the insulating substrate.

The magnetic body may include a core and a winding coil wound around the core.

The inductor may be a power inductor.

The first and second capacitors and the first and second inductors may be connected by a conductive adhesive.

Referring to FIG. 14, the first internal electrode 431 may have a lead out portion 431a exposed to the first end surface of the composite body 430, the second internal electrode 432 may have a lead out portion 432a exposed to the first lateral surface of the composite body 430, and the third internal electrode 433 may have a lead out portion 433a exposed to the second end surface of the composite body 430.

Similarly, the fourth internal electrode 434 may have a lead out portion 434a exposed to the first end surface of the composite body 430, the fifth internal electrode 435 may have a lead out portion 435a exposed to the first lateral surface of the composite body 430, and the sixth internal electrode 436 may have a lead out portion 436a exposed to the second end surface of the composite body 430.

Referring to FIG. 15, according to the present exemplary embodiment, in the first capacitor 410a, the first and second internal electrodes 431 and 432 may form a first capacitor unit, and the first capacitor unit may be a capacitor formed between connection terminals of battery and the power management unit (or PMIC) and a ground as described hereinafter.

Namely, the first capacitor unit may reduce noise included in the first power.

Also, the first capacitor unit may charge electric charges. In a case in which the power management unit (or PMIC) instantaneously consumes a large amount of current, the first capacitor unit may discharge charged electric charges to suppress voltage fluctuations in the power management unit.

Meanwhile, in the first capacitor 410a, the second and third internal electrodes 432 and 433 may form a second capacitor unit, and here, the second capacitor unit may be a capacitor formed between connection terminals of the power management unit (or PMIC) and the output terminal Vdd and a ground, like the capacitor 110 of the composite electronic component according to the former exemplary embodiment as described above.

The second capacitor unit may reduce noise included in second power output from the power management unit (or PMIC).

In the first capacitor 410a, the second internal electrodes 432 may constitute the first and second capacitor units, respectively, and connected to the first ground terminal 453a formed on the first lateral surface of the composite body 430 so as to be grounded in one direction.

In the second capacitor 410b, the fourth to sixth internal electrodes 434,435, and 436 play the same role as those of the first to third internal electrodes 431, 432, and 433, so a description thereof will be omitted.

Other features of the present exemplary embodiment are identical to those of the composite electronic component according to the former exemplary embodiment, so a description thereof will be omitted to avoid redundancy.

Figure 16:
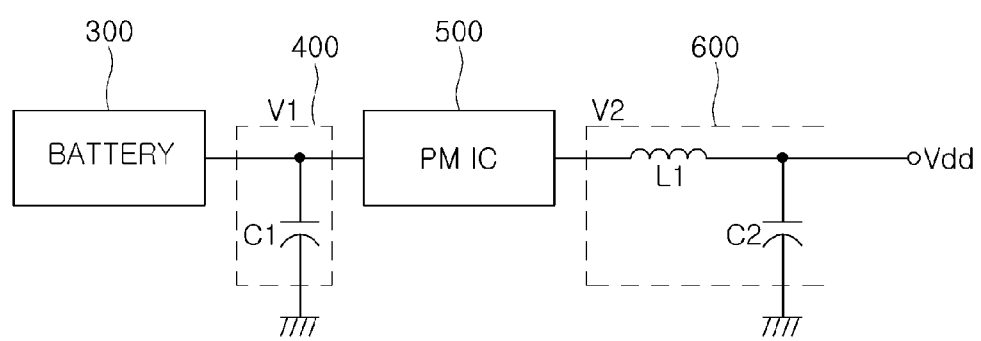
FIG. 16 is a view illustrating a driving power supply system supplying driving power through a battery and a power management unit to a predetermined terminal requiring driving power according to an exemplary embodiment of the present disclosure.

FIG. 16 is a view illustrating a driving power supply system supplying driving power through a battery and a power management unit to a predetermined terminal requiring driving power according to an exemplary embodiment of the present disclosure.

Referring to FIG. 16, the driving power supply system may include a battery 300, a first power smoothing unit 400, a power management unit 500 (or power management integrated circuit (PMIC), and a second power smoothing unit 600.

The battery 300 may supply power to the power management unit 500. Here, power supplied by the battery 300 to the power management unit 500 is defined as first power.

The first power smoothing unit 400 may smooth the first power V1 and supply the smoothed first power to the power management unit 500. In detail, the first power smoothing unit 400 may include a capacitor C1 formed between connection terminals of the battery 300 and the power management unit 500 and a ground. The capacitor C1 may reduce noise included in the first power.

Also, the capacitor C1 may charge electric charges. In a case in which the power management unit 500 instantaneously consumes a large amount of current, the capacitor C1 may discharge charged electric charges to suppress voltage fluctuations in the power management unit 500.

The capacitor C1 may be a capacitor having high capacitance and including 300 or more dielectric layers.

The power management unit 500 serves to convert power introduced to an electronic device into a form suited for the electronic device, and distribute, charge, and control power. Thus, in general, the power management unit 500 may include a DC/DC converter.

Also, the power management unit 500 may be implemented as a power management integrated circuit (PMIC).

The power management unit 500 may convert the a first power V1 into a second power V2. The second power V2 may be a power requested by an active element such as an IC, or the like, connected to an output terminal of the power management unit 500 to receive a driving power.

The second power smoothing unit 600 may smooth the second power V2 and deliver the smoothed second power to an output terminal Vdd. An active element such as IC, or the like, provided with driving power from the power management unit 500 may be connected to the output terminal Vdd.

In detail, the second power smoothing unit 600 may include an inductor L1 connected in series between the power management unit 500 and the output terminal Vdd. Also, the second power smoothing unit 600 may include a capacitor C2 formed between connection terminals of the power management unit 500 and the output terminal Vdd and a ground.

The second power smoothing unit 600 may reduce noise included in the second power V2.

Also, the second power smoothing unit 600 may stably supply power to the output terminal Vdd.

The inductor L1 may be a power inductor applicable to a high current.

The power inductor may be an efficient inductor whose inductance is changed to be less than that of a general inductor when a DC voltage is applied thereto. Namely, the power inductor may be considered an inductor having even DC bias characteristics (a change in inductance when a DC voltage is applied) in addition to a function of a general inductor.

Also, the capacitor C2 may be a capacitor having a high capacitance (or a high capacitance capacitor).

Figure 17:
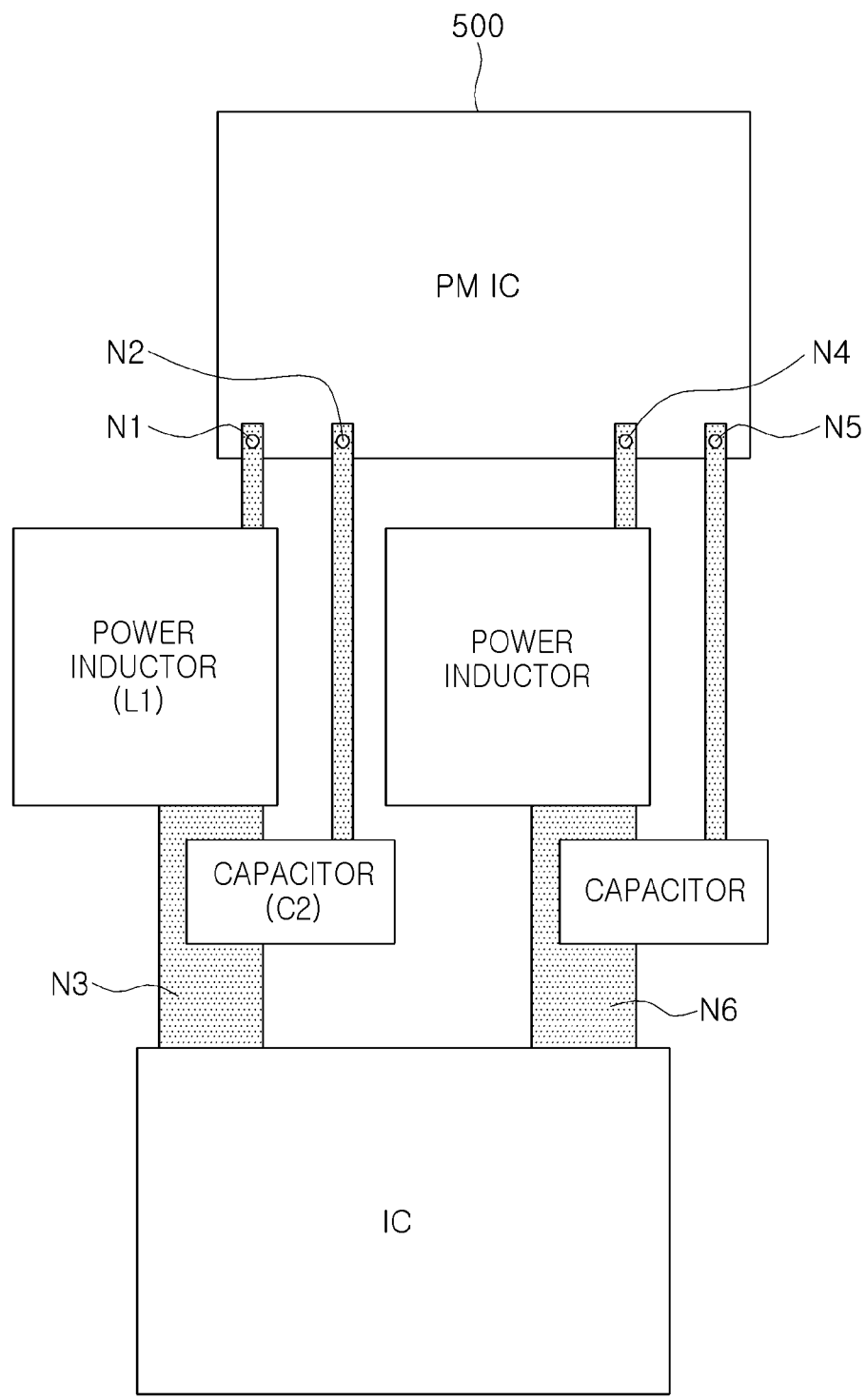
FIG. 17 is a view illustrating a layout pattern of the driving power supply system.

FIG. 17 is a view illustrating a layout pattern of the driving power supply system.

Referring to FIG. 17, a layout pattern of the power management unit 500, the power inductor L1, and the second capacitor C2 may be recognized.

In general, the power management unit 500 (or PMIC) may have a few to tens of DC/DC converters. Also, in order to implement functions of the DC/DC converters, each of the DC/DC converters requires a power inductor and a high capacitance capacitor.

Referring to FIG. 17, the power management unit 500 may include predetermined terminals N1 and N2. The power management unit 500 may receive power from the battery and convert the power by using the DC/DC converters. Also, the power management unit 500 may supply converted power through the first terminal N1. The second terminal N2 may be a ground terminal.

Here, the first power inductor L1 and the second capacitor C2 may receive a power from the first terminal N1, smooth the received power, and supply a driving power through the third terminal N3, thus performing the function of the second power smoothing unit.

Fourth to sixth terminals N4 to N6 illustrated in FIG. 17 perform functions identical to those of the first to third terminals N1 to N3, so detailed descriptions thereof will be omitted.

To be considered important in designing a pattern of the driving power supply system is that the power management unit, the power inductor, and the high capacitance capacitor need to be disposed as close as possible. Also, the wiring of a power line needs to be designed to be short and thick.

This is due to the fact that a component layout area may be reduced and noise generation may be suppressed when such requirements are met.

In a case in which the number of output terminals of the power management unit 500 is small, there is no problem in disposing the power inductor and the high capacitance capacitor to be close. However, if several outputs of the power management unit 500 are to be used, the power inductor and the high capacitance capacitor may not be properly disposed due to component compactness. Also, the power inductor and the high capacitance capacitor may be disposed in a non-optimized state according to power priority.

For example, since the power inductor and the high capacitance capacitor have a large size, a power line and a signal line may inevitably be lengthened when elements are actually disposed.

In a state in which the power inductor and the high capacitance capacitor are disposed in a non-optimized state, intervals between respective elements and power lines are lengthened, generating noise which may negatively affect the power supply system.

Figure 18:
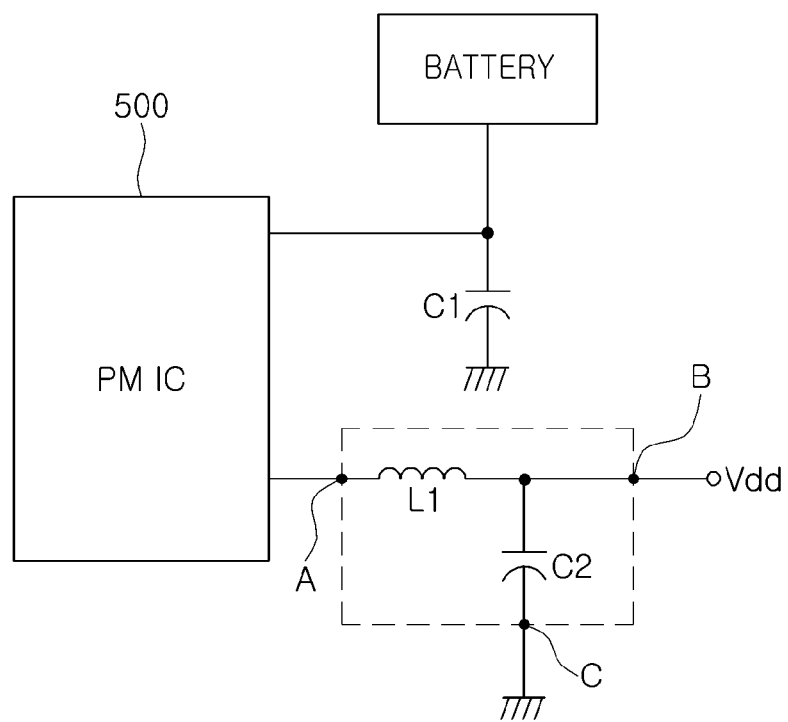
FIG. 18 is a circuit diagram of a composite electronic component according to an exemplary embodiment of the present disclosure.

FIG. 18 is a circuit diagram of a composite electronic component according to an exemplary embodiment of the present disclosure.

Referring to FIG. 18, a composite electronic component 700 may include an input terminal A, a power smoothing unit, an output terminal B, and a ground terminal C.

The power smoothing unit may include a power inductor L1 and a second capacitor C2.

The composite electronic component 700 may be an element serving as the second power smoothing unit as described above.

The input terminal A may receive a power which has been converted by the power management unit 500.

The power smoothing unit may smooth the power received from the input terminal A.

The output terminal B may supply the smoothed power to the output terminal Vdd.

The ground terminal C may connect the power smoothing unit to a ground.

Meanwhile, the power smoothing unit includes the power inductor L1 connected between the input terminal A and the output terminal B and the second capacitor C2 connected between the ground terminal C and the output terminal B.

Referring to FIG. 18, since the power inductor L1 and the second capacitor C2 share the output terminal B, a space between the power inductor L1 and the capacitor C2 may be reduced.

In this manner, in the composite electronic component 700, the power inductor and the high capacitance capacitor provided in an output power terminal of the power management unit 500 are implemented as a single component. Thus, the composite electronic component 700 has enhanced element integration.

Figure 19:
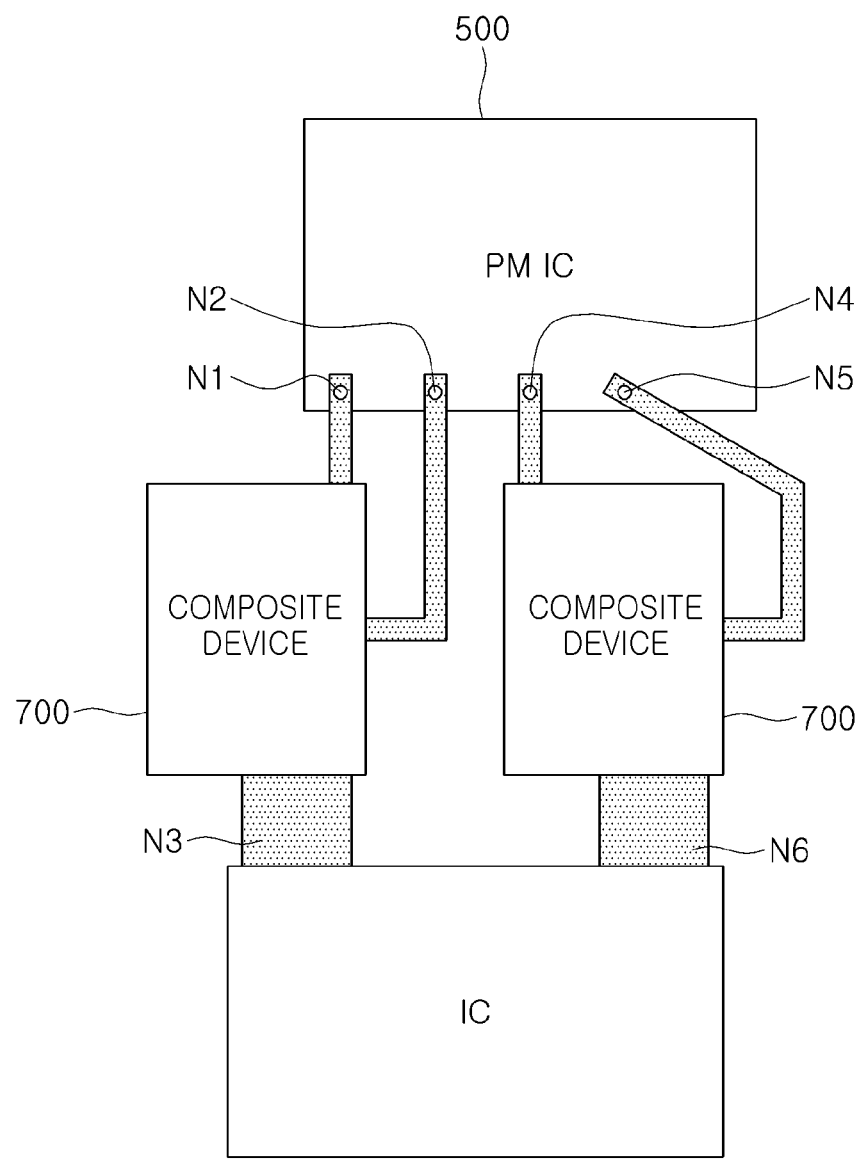
FIG. 19 is a view illustrating a layout pattern of a driving power supply system employing a composite electronic component according to an exemplary embodiment of the present disclosure.

FIG. 19 is a view illustrating a layout pattern of a driving power supply system employing a composite electronic component according to an exemplary embodiment of the present disclosure.

Referring to FIG. 19, it can be seen that the second capacitor C2 and the power inductor L1 illustrated in FIG. 17 are replaced with a composite electronic component according to the exemplary embodiment of the present disclosure.

As previously mentioned, the composite electronic component may serve as the second power smoothing unit.

Also, by replacing the second capacitor C1 and the power inductor L1 with the composite electronic component according to the exemplary embodiment of the present disclosure, a length of wiring may be minimized. Also, since the number of disposed elements is reduced, an optimal element layout may be accomplished.

Namely, according to the exemplary embodiment of the present disclosure, the power management unit, the power inductor, and the high capacitance capacitor may be disposed as close to one another as possible, and since wirings of power lines are designed to be short and thick, noise may be reduced.

Meanwhile, electronic device manufacturers have strived to reduce a size of PCBs provided in electronic devices to meet consumer demand. Thus, it needs to enhance a degree of integration of ICs mounted on PCBs. In the exemplary embodiment of the present disclosure, since a plurality of elements are combined as a single composite component, like the composite electronic component, such demand may be satisfied.

Also, according to the exemplary embodiment of the present disclosure, since two components (second capacitor and power inductor) are implemented as a single composite electronic component, a PCB mounting area may be reduced. According to the exemplary embodiment of the present disclosure, a mounting area may be reduced by approximately 10% to 30% over an existing layout pattern.

Also, according to the exemplary embodiment of the present disclosure, the power management unit 500 may supply power to an IC to receive driving power, by a shortest wiring.

Also, in the composite electronic component according to the exemplary embodiment of the present disclosure, since the capacitor is disposed on the side of the inductor 120, the influence of magnetic flux generated by the inductor on the internal electrodes of the capacitor may be minimized to prevent a change in a self-resonant frequency (SRF).

In addition, in the composite electronic component according to the exemplary embodiment of the present disclosure, since the capacitor is disposed on the side of the inductor, a degradation of a Q factor of components may be prevented.

Board Having Multilayer Ceramic Capacitor Mounted Thereon

Figure 20:
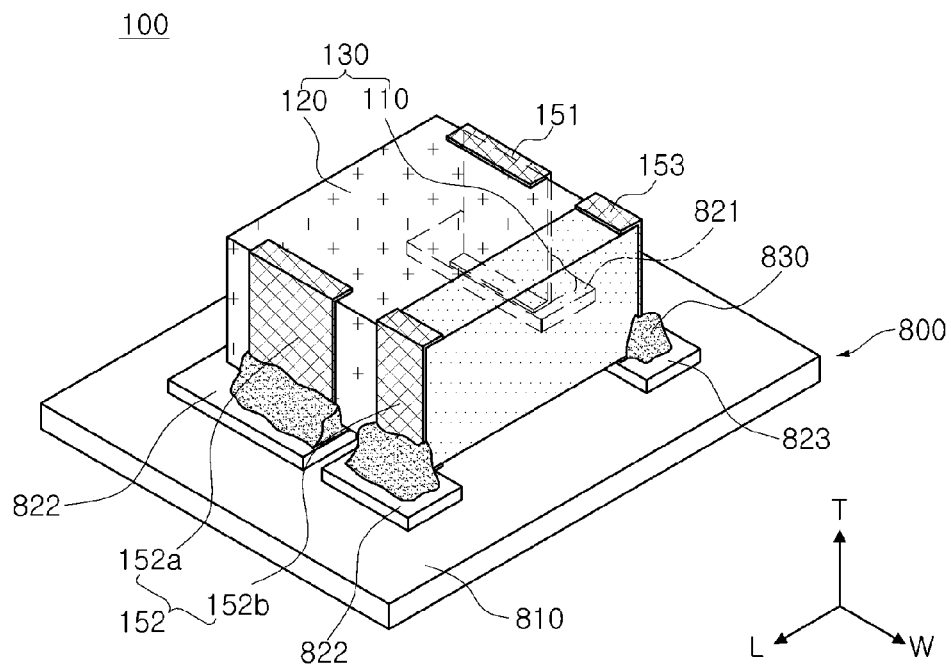
FIG. 20 is a perspective view illustrating the composite electronic component of FIG. 1 mounted on a printed circuit board.

FIG. 20 is a perspective view illustrating the composite electronic component of FIG. 1 mounted on a printed circuit board (PCB).

Referring to FIG. 20, a mounting board 800 of a composite electronic component 100 according to the present exemplary embodiment includes a printed circuit board (PCB) 810 on which the composite electronic component 100 is mounted, and three or more electrode pads 821, 822, and 823 formed on an upper surface of the PCB 810.

The electrode pads 821, 822, and 823 may be formed as first to third electrode pads 821, 822, and 823 connected to an input terminal 151, an output terminal 152, and a ground terminal 153 of the composite electronic component 100, respectively.

Here, in a state in which the input terminal 151, the output terminal 152, and the ground terminal 153 of the composite electronic component 100 are positioned to be in contact with the first to third electrode pads 821, 822, and 823, the composite electronic component 100 may be electrically connected to the PCB 210 by solder 830.

Also, the composite electronic component mounted on the PCB may be a composite electronic component according to another exemplary embodiment of the present disclosure and a description thereof will be omitted to avoid redundancy.

Table 1 illustrates changes in inductance (Ls), Q factor, and SRF of frequencies according to Embodiment Example, Comparative Example 1, and Comparative Example 2.

In Table 1, the Embodiment Example is a composite electronic component formed by laterally combining an inductor and a capacitor, Comparative Example 1 is a power inductor used alone, and Comparative Example 2 is a composite electronic component formed by vertically combining an inductor and a capacitor.

TABLE 1

| | | Frequency | | | |
|---|---|---|---|---|---|
| | | 1 MHz | 3 MHz | 6 MHz | 9 MHz |
| Embodiment Example | Ls (μH) | 0.47 | 0.47 | 0.47 | 0.46 |
| | Q | 38.5 | 29.8 | 24.1 | 18.1 |
| | SRF (MHz) | | | 96 | |
| Comparative Example 1 | Ls (μH) | 0.47 | 0.46 | 0.46 | 0.47 |
| | Q | 39.1 | 30.2 | 24.8 | 19.3 |
| | SRF (MHz) | | | 121 | |
| Comparative Example 2 | Ls (μH) | 0.46 | 0.46 | 0.45 | 0.46 |
| | Q | 25.6 | 22.0 | 15.2 | 12.3 |
| | SRF (MHz) | | | 23 | |

Referring to Table 1, in the case of the Embodiment Example as a composite electronic component formed by laterally combining an inductor and a capacitor, it can be seen that changes in inductance (Ls), Q factor, and SRF of frequencies were not significantly different from those of Comparative Example 1 representing a power inductor used alone.

In contrast, in the case of Comparative Example 2 as a composite electronic component formed by vertically combining an inductor and a capacitor, it can be seen that Q factor was degraded and SRF was shifted to a low frequency range, limiting usage coverage of the inductor, compared to Embodiment Example as a composite electronic component formed by laterally combining an inductor and a capacitor and Comparative Example 1 as a power inductor used alone.

Figure 21:
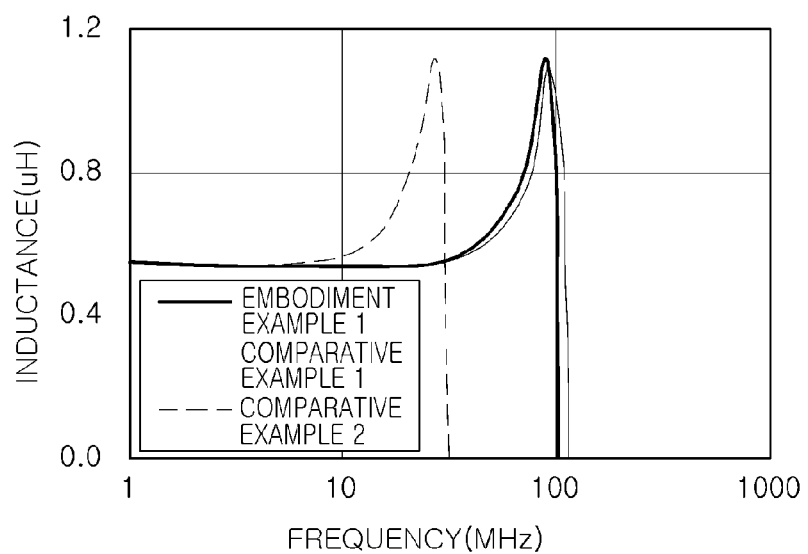
FIG. 21 is a graph illustrating changes in self-resonant frequencies (SRF) according to Embodiment Example and Comparative Examples.

FIG. 21 is a graph illustrating changes in self-resonant frequencies (SRF) according to Embodiment Example and Comparative Examples.

Referring to FIG. 21, Embodiment Example 1 is a composite electronic component formed by laterally combining an inductor and a capacitor, Comparative Example 1 is a power inductor used alone, and Comparative Example 2 is a composite electronic component formed by vertically combining an inductor and a capacitor.

Referring to the graph, in the case of Embodiment Example 1 as a composite electronic component formed by laterally combining an inductor and a capacitor, it can be seen that the SRF was substantially equal to that of Comparative Example 1 as a power inductor used alone.

In contrast, in the case of Comparative Example 2 as a composite electronic component formed by vertically combining an inductor and a capacitor, it can be seen that the SRF was shifted to a low frequency range, limiting usage coverage of the inductor.

Figure 22:
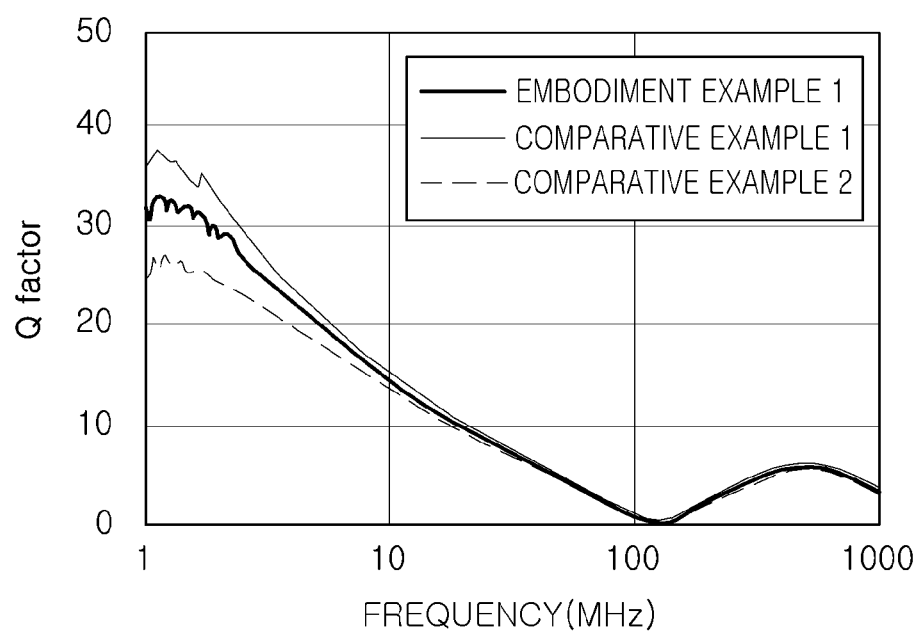
FIG. 22 is a graph illustrating changes in quality factors (Q factors) according to Embodiment Example and Comparative Examples.

FIG. 22 is a graph illustrating changes in quality factors (Q factors) according to Embodiment Examples and Comparative Examples.

Referring to FIG. 22, Embodiment Example 1 is a composite electronic component formed by laterally combining an inductor and a capacitor, Comparative Example 1 is a power inductor used alone, and Comparative Example 2 is a composite electronic component formed by vertically combining an inductor and a capacitor.

Referring to the graph, in the case of Embodiment Example 1 as a composite electronic component formed by laterally combining an inductor and a capacitor, it can be seen that the Q factor thereof was substantially equal to that of Comparative Example 1 as a power inductor used alone.

In contrast, in the case of Comparative Example 2 as a composite electronic component formed by vertically combining an inductor and a capacitor, it can be seen that the Q factor thereof was lowered, compared to Embodiment Example 1 as a composite electronic component formed by laterally combining an inductor and a capacitor and Comparative Example 1 as a power inductor used alone.

As set forth above, according to exemplary embodiments of the present disclosure, a composite electronic component capable of reducing an area for mounting components in a driving power supply system may be provided.

Also, a composite electronic component capable of suppressing generation of noise in a driving power supply system may be provided.

In addition, in the composite electronic component according to the exemplary embodiment of the present disclosure, since the capacitor is disposed on the side of the inductor 120, the influence of magnetic flux generated by the inductor on the internal electrodes of the capacitor may be minimized to prevent a change in a self-resonant frequency (SRF).

Moreover, in the composite electronic component according to the exemplary embodiment of the present disclosure, since the capacitor is disposed on the side of the inductor, a degradation of a Q factor of components may be prevented.

While exemplary embodiments have been shown and described above, it will be apparent to those skilled in the art that modifications and variations could be made without departing from the spirit and scope of the present disclosure as defined by the appended claims.

What is claimed is:

1. A composite electronic component comprising:
a composite body including a capacitor and an inductor being attached to each other, the capacitor having a ceramic body in which a plurality of dielectric layers and first and second internal electrodes are laminated, the first and second internal electrodes being disposed to face each other with at least one among the plurality of dielectric layers interposed therebetween, and the inductor having a magnetic body including a coil;
an input terminal disposed on a first end surface of the composite body and connected to the coil of the inductor;
output terminals including a first output terminal disposed on a second end surface of the composite body and connected to the coil of the inductor and a second output terminal formed on the second end surface of the composite body and connected to the first internal electrodes of the capacitor; and
a ground terminal disposed on one or more of upper and lower surfaces and a first end surface of the capacitor of the composite body and connected to the second internal electrodes of the capacitor,
wherein a surface interfacing the inductor and the capacitor is substantially parallel to a magnetic flux of the coil of the inductor.

2. The composite electronic component of claim 1, wherein the magnetic body includes a plurality of magnetic layers, each of which has a conductive pattern formed thereon, and the conductive patterns constitutes the coil.

3. The composite electronic component of claim 1, wherein the inductor is a thin film type inductor in which the magnetic body includes an insulating layer and the coil disposed on at least one surface of the insulating layer.

4. The composite electronic component of claim 1, wherein the magnetic body includes a core and the coil wound around the core.

5. The composite electronic component of claim 1, wherein the inductor is a power inductor.

6. The composite electronic component of claim 1, wherein the capacitor and the inductor are connected by a conductive adhesive.

7. A board having a composite electronic component mounted thereon, the board comprising:
   a printed circuit board (PCB) having three or more electrode pads disposed on an upper surface thereof;
   the composite electronic component according to claim 1 installed on the PCB; and
   solder connecting the three or more electrode pads and the composite electronic component.

8. The composite electronic component of claim 1, wherein the surface interfacing the inductor and the capacitor is substantially parallel to an axis of the coil of the inductor, and the axis of the coil of the inductor is in a stacking direction of the coil of the inductor.

9. A composite electronic component comprising:
   a composite body including a capacitor and an inductor being attached to each other, the capacitor including a ceramic body in which a plurality of dielectric layers and first to third internal electrodes are laminated, the first to third internal electrodes being disposed to face each other with at least one among the plurality of dielectric layers interposed therebetween, and the inductor having a magnetic body including a coil;
   input terminals including a first input terminal disposed on a first end surface of the composite body and connected to the coil of the inductor, and a second input terminal disposed on the first end surface of the composite body and connected to the first internal electrodes of the capacitor;
   output terminals including a first output terminal disposed on a second end surface of the composite body and connected to the coil of the inductor and a second output terminal disposed on the second end surface of the composite body and connected to the third internal electrodes of the capacitor; and
   a ground terminal disposed on one or more of upper and lower surfaces and a first lateral surface of the capacitor of the composite body and connected to the second internal electrodes of the capacitor,
   wherein a surface interfacing the inductor and the capacitor is substantially parallel to a magnetic flux of the coil of the inductor.

10. The composite electronic component of claim 9, wherein the surface interfacing the inductor and the capacitor is substantially parallel with the first to third internal electrodes.

11. The composite electronic component of claim 9, wherein the surface interfacing the inductor and the capacitor is substantially perpendicular to the first to third internal electrodes.

12. A board having a composite electronic component mounted thereon, the board comprising:
   a printed circuit board (PCB) having three or more electrode pads disposed on an upper surface thereof;
   the composite electronic component according to claim 8 installed on the PCB;
   and solder connecting the electrode pads and the composite electronic component.

13. The composite electronic component of claim 9, wherein each of the first internal electrodes has a lead out portion exposed to the first end surface of the composite body, each of the second internal electrodes has a lead out portion exposed to the first lateral surface of the capacitor of the composite body, and each of the third internal electrodes has a lead out portion exposed to the second end surface.

14. The composite electronic component of claim 9, wherein the surface interfacing the inductor and the capacitor is substantially parallel to an axis of the coil of the inductor, and the axis of the coil of the inductor is in a stacking direction of the coil of the inductor.

15. A composite electronic component comprising:
   an input terminal receiving converted power from a power management unit;
   a power smoothing unit smoothing the power and including a composite body including a capacitor and an inductor being adjacent each other, the capacitor having a ceramic body in which a plurality of dielectric layers and first and second internal electrodes are laminated, the first and second internal electrodes being disposed to face one another with at least one of the dielectric layers interposed therebetween, and the inductor having a magnetic body including a coil,
   wherein a surface interfacing the inductor and the capacitor is substantially parallel to a magnetic flux of the coil of the inductor;
   an output terminal supplying the smoothed power; and
   a ground terminal for grounding.

16. The composite electronic component of claim 15, wherein the inductor is a thin film type inductor in which the magnetic body includes an insulating layer and the coil disposed on at least one surface of the insulating layer.

17. The composite electronic component of claim 15, wherein the magnetic body includes a core and the coil wound around the core.

18. The composite electronic component of claim 15, wherein the inductor is a power inductor.

19. The composite electronic component of claim 15, wherein the capacitor and the inductor are connected by a conductive adhesive.

20. A board having a composite electronic component mounted thereon, the board comprising:
   a printed circuit board (PCB) having three or more electrode pads disposed on an upper surface thereof;
   the composite electronic component according to claim 15 installed on the PCB; and
   solder connecting the three or more electrode pads and the composite electronic component.

21. The composite electronic component of claim 15, wherein the surface interfacing the inductor and the capacitor is substantially parallel to an axis of the coil of the inductor, and the axis of the coil of the inductor is in a stacking direction of the coil of the inductor.

22. The composite electronic component of claim 15, wherein the magnetic body includes a plurality of magnetic layers, each having a conductive pattern formed thereon, and the conductive patterns constitutes the coil.

23. The composite electronic component of claim 15, wherein the input terminal is disposed on a first end surface of the composite body, the output terminal includes a first output terminal disposed on a second end surface of the composite body and connected to the coil of the inductor and a second output terminal disposed on the second end surface of the composite body and connected to the first internal electrodes of the capacitor, and the ground terminal is disposed on one or more of upper and lower surfaces and the first end surface of the capacitor of the composite body and connected to the second internal electrodes of the capacitor.

24. A composite electronic component comprising:
a composite body including a first capacitor, an inductor and a second capacitor, the first and second capacitors being attached to two opposing sides of the inductor respectively, wherein the first capacitor has a ceramic body in which a plurality of dielectric layers and first and second internal electrodes are laminated, the first and second internal electrodes being disposed to face one another with at least one among the plurality of dielectric layers interposed therebetween, the second capacitor has a ceramic body in which a plurality of dielectric layers and third and fourth internal electrodes are laminated, the third and fourth internal electrodes being disposed to face one another with the dielectric layers interposed therebetween, and the inductor has a magnetic body including a coil;
input terminals including a first input terminal disposed on a first end surface of the composite body and connected to the coil of the inductor and a second input terminal disposed on the first end surface of the composite body and connected to the first internal electrodes of the first capacitor;
output terminals including a first output terminal disposed on a second end surface of the composite body and connected to the coil of the inductor and a second output terminal disposed on the first end surface of the composite body and connected to the third internal electrodes of the second capacitor; and
ground terminals including a first ground terminal disposed on the second end surface of the composite body and connected to the second internal electrodes of the first capacitor and a second ground terminal disposed on the second end surface of the composite body and connected to the fourth internal electrodes of the second capacitor,
wherein a surface interfacing the inductor and the first capacitor is substantially parallel to an axis of the coil of the inductor.

25. A board having a composite electronic component mounted thereon, the board comprising:
a printed circuit board (PCB) having three or more electrode pads disposed on an upper surface thereof;
the composite electronic component according to claim 24 installed on the PCB; and
solder connecting the three or more electrode pads and the composite electronic component.

26. The composite electronic component of claim 24, wherein the axis of the coil of the inductor is in a stacking direction of the coil of the inductor.

27. A composite electronic component comprising:
a composite body including a first capacitor,
a second capacitor,
a first inductor, and
a second inductor, the first inductor and the second inductor being adjacent each other, the first capacitor being attached to a side of the first inductor and the second capacitor being attached to a side of the second inductor, wherein the first capacitor has a ceramic body in which a plurality of dielectric layers and first to third internal electrodes are laminated, the first to third internal electrodes being disposed to face each other with the dielectric layers interposed therebetween, a second capacitor has a ceramic body in which a plurality of dielectric layers and fourth to sixth internal electrodes are laminated, the fourth to sixth internal electrodes being disposed to face each other with at least one among the plurality of dielectric layers interposed therebetween, and each of the first and second inductors has a magnetic body including a coil;
input terminals including a first input terminal disposed on a first end surface of the composite body and connected to the coil of the second inductor, a second input terminal disposed on the first end surface of the composite body and connected to the coil of the second inductor,
a third input terminal disposed on the first end surface of the composite body and connected to the first internal electrodes of the first capacitor, and a fourth input terminal disposed on the first end surface of the composite body and connected to the fourth internal electrodes of the second capacitor;
output terminals including a first output terminal disposed on a second end surface of the composite body and connected to the coil of the first inductor, a second output terminal disposed on the second end surface of the composite body and connected to the coil of the second inductor,
a third output terminal disposed on the second end surface of the composite body and connected to the third internal electrodes of the first capacitor, and
a fourth output terminal disposed on the second end surface of the composite body and connected to the sixth internal electrodes of the second capacitor; and
ground terminals including a first ground terminal disposed on one or more of upper and lower surfaces and a first lateral surface of the first capacitor of the composite body and connected to the second internal electrodes of the first capacitor and a second ground terminal disposed on one or more of upper and lower surfaces and a first lateral surface of the second capacitor of the composite body and connected to the fifth internal electrodes of the second capacitor.

28. A board having a composite electronic component mounted thereon, the board comprising:
a printed circuit board (PCB) having three or more electrode pads disposed on an upper surface thereof;
the composite electronic component according to claim 27 installed on the PCB; and
solder connecting the three or more electrode pads and the composite electronic component.

* * * * *